(12) United States Patent
Uchiki et al.

(10) Patent No.: US 6,646,486 B2
(45) Date of Patent: Nov. 11, 2003

(54) SEMICONDUCTOR INTEGRATED CIRCUIT (75) Inventors: Hideki Uchiki, Tokyo (JP); Harufusa Kondoh, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/033,927

(22) Filed: Jan. 3, 2002

(65) Prior Publication Data

US 2002/0153944 A1 Oct. 24, 2002

(30) Foreign Application Priority Data

Apr. 18, 2001 (JP) ........................................ 2001-120000

(51) Int. Cl.⁷ .............................................. H03K 3/289
(52) U.S. Cl. ......................................... 327/202; 327/51
(58) Field of Search ............................. 327/51, 52, 54, 327/65, 67, 77, 85, 103, 202, 203, 309, 320, 108, 112, 208, 210, 563

(56) References Cited

U.S. PATENT DOCUMENTS 6,060,938 A  *  5/2000  Morrill ........................ 327/112
6,339,357 B1     1/2002  Yamasaki et al.
6,348,825 B1  *  2/2002  Galbi et al. ................. 327/202
6,366,141 B1  *  4/2002  Chiba et al. ................. 327/108
6,417,711 B2  *  7/2002  Fulkerson .................... 327/203
2002/0053943 A1  5/2002  Yamasaki et al.

FOREIGN PATENT DOCUMENTS

| JP | 8-507663 | 8/1996 |
| JP | 11-41081 | 2/1999 |
| TW | 374928 | 11/1999 |
| WO | 94-19866 | 9/1994 |

* cited by examiner

*Primary Examiner*—Toan Tran
(74) *Attorney, Agent, or Firm*—Burns, Doane, Swecker & Mathis, LLP (57) ABSTRACT

The semiconductor integrated circuit includes a first transistor which flows a current from a high voltage source to a first node, a second transistor which flows a current from the first node to a low voltage source. Furthermore, a first inverter receives an input signal and drives the first node based on this input signal, and a second inverter drives a second node based on a voltage of the first node.

17 Claims, 9 Drawing Sheets

SEMICONDUCTOR INTEGRATED CIRCUIT

FIELD OF THE INVENTION

The present invention relates to a semiconductor integrated circuit for amplifying input signals.

BACKGROUND OF THE INVENTION

Figure 1:
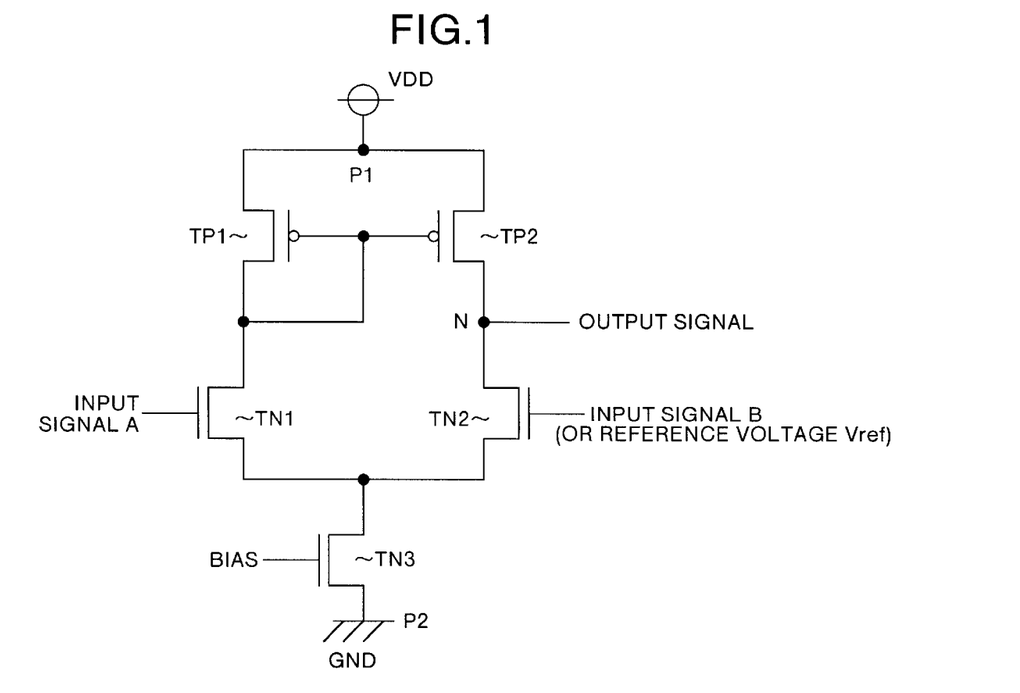
FIG. 1 is a circuit structure diagram of a differential amplifier according to a conventional technique.

FIG. 1 shows a differential amplifier that has been well known conventionally. This differential amplifier is a type of amplifier using a current mirror consisting of pMOS transistors TP1 and TP2 as a load. The differential amplifier receives input signals A and B from gate electrodes of nMOS transistors TN1 and TN2 respectively, amplifies a differential voltage of these input signals, and outputs the amplified signal from the node N between the pMOS transistor TP2 and the nMOS transistor TN2. A fixed bias voltage is applied to a gate electrode of an nMOS transistor TN3 as a constant current source.

Figure 2:
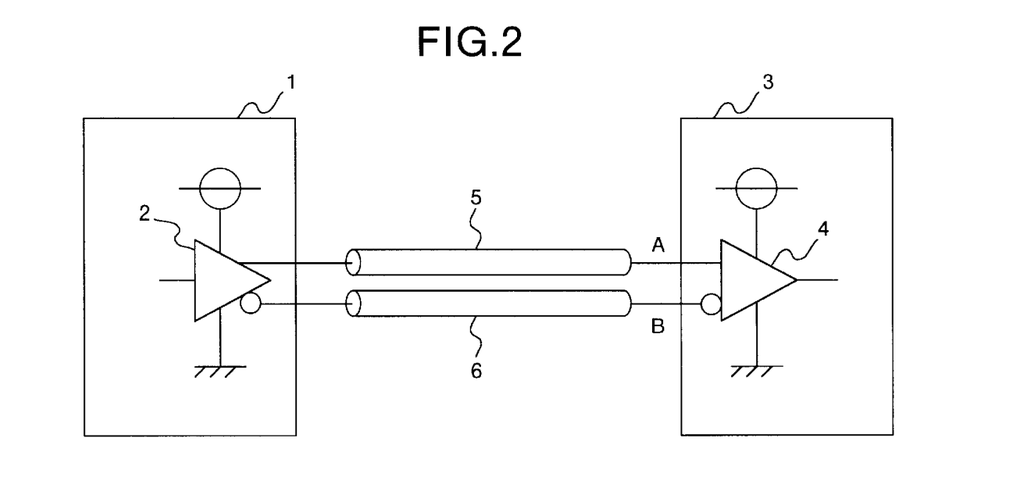
FIG. 2 is a structure diagram showing a structure for transferring signals from one of two LSIs to the other LSI according to a conventional technique.

This differential amplifier is also used as an input buffer. As shown in FIG. 2, the input buffer 4 is formed on a semiconductor ship 3 and the output buffer 2 is mounted on a separate semiconductor chip 1. The output buffer 2 outputs the signal A and the signal B that is the inverse signal of the signal A via the transmission paths 5 and 6 respectively. The input buffer 4 includes the differential amplifier shown in FIG. 1. The input buffer 4 supplies output signals to a main circuit formed within the same semiconductor chip 3. The signals A and B are applied to the gate electrodes of the MOS transistors TN1 and TN2 in the input buffer 4 respectively.

When the conventional differential amplifier is applied to the input buffer 4 shown in FIG. 2, a common level of an input signal that the input buffer 4 receives is different depending on the facing output buffer 2. The common level is a center level Vc between a maximum voltage VH0 and a minimum voltage VL0 of an amplitude of the input signal (Vc=(VH0+VL0)/2). When the common level becomes low for the input signal of the same amplitude, the voltage at the gate terminal versus the voltage at the source terminal of each of the MOS transistors TN1 and TN2 does not easily exceed the own threshold voltage. Therefore, the waveform of the output signal collapses, and the duty of the output signal versus the duty of the input signal changes, for example. Further, when the common level has lowered to an extent that the voltage at the gate terminal versus the voltage at the source terminal of each of the MOS transistors TN1 and TN2 does not completely exceed the own threshold voltage, the differential amplifier does not operate.

SUMMARY OF THE INVENTION

It is an object of the present invention to provide a semiconductor integrated circuit capable of outputting a signal of which level changes in response to an input signal even when the common level of the input signal has varied.

The semiconductor integrated circuit according to one aspect of the present invention comprises a first element for flowing a current from a voltage line applied with a first voltage to a first node, and a second element for flowing a current from the first node to a second voltage line applied with a second voltage, thereby to set a predetermined bias voltage.

The semiconductor integrated circuit is further provided with a first inverter having its output connected to the first node, for changing a voltage of the first node in a direction opposite to a direction of a voltage change of the input signal in response to the voltage change of the input signal, thereby to produce a voltage biased in a direction of a bias voltage having a common level of the input signal set to the first node.

The semiconductor integrated circuit is further provided with a second inverter having its output connected to the second node, for changing a voltage of the second node in a direction opposite to a direction of a voltage change of the first node in response to the voltage change of the first node, thereby to amplify a signal having an amplitude at the biased common level. With this arrangement, even when the common level of the input signal has varied, it is possible to output a signal of which signal level changes in response to the input signal.

According to another aspect of the invention, there is provided a semiconductor integrated circuit of the above aspect, wherein the first inverter has a third element connected between a third voltage line applied with the first voltage and the first node, for flowing a current from the third voltage line to the first node, and a fourth element connected between a fourth voltage line applied with the second voltage and the first node, for flowing a current from the first node to the fourth voltage line. In this case, when the first and second elements always flow currents and when the currents flown by the first and second elements are set larger than the currents flown by the third and fourth elements respectively, a variable range of the common level of the input signal becomes larger.

Further, according to still another aspect of the invention, there is provided a semiconductor integrated circuit of the above aspect, wherein the semiconductor integrated circuit further comprises a third inverter for changing a voltage of the second node in a direction opposite to a direction of a voltage change of a another input signal in response to the voltage change of the another input signal. When the another input signal is inversely logical to the input signal, the third inverter works to advance the voltage change of the first node.

The second inverter includes a MOS transistor having a drain terminal connected to the second node and a gate terminal connected to the node N1. The third inverter includes a MOS transistor having a drain terminal connected to the second node and a gate terminal for receiving the another input signal. When the driving capacity of the MOS transistor of the third inverter is smaller than that of the second inverter, a variable range of the common level of the input signal becomes larger.

According to still another aspect of the invention, there is provided a semiconductor integrated circuit of the above aspect, wherein the semiconductor integrated circuit further comprises a third element connected between a power source line for receiving a power source voltage and the first voltage line, for flowing a current from the power source line to the first voltage line. The first voltage line is connected in common to the first and second inverters. It is possible to reduce power consumption by adjusting the volume of current flowing through the third element. Similarly, the semiconductor integrated circuit further comprises a fourth element connected between a ground line for receiving a ground voltage and the second voltage line, for flowing a current from the second voltage line to the ground line. The second voltage line is connected in common to the first and second inverters. It is possible to reduce power consumption by adjusting the volume of current flowing through the fourth element.

The first inverter includes, for example, a p-channel type first transistor having a source terminal for receiving the first voltage, a drain terminal connected to the first node, and a gate terminal for receiving an input signal, and an n-channel type second transistor having a source terminal for receiving the second voltage, a drain terminal connected to the first node, and a gate terminal for receiving an input signal. Further, the second inverter includes for example, a p-channel type third MOS transistor having a source terminal for receiving the first voltage, a drain terminal connected to the second node, and a gate terminal connected to the first node, and an n-channel type fourth MOS transistor having a source terminal for receiving the second voltage, a drain terminal connected to the second node, and a gate terminal connected to the first node.

The third inverter includes, for example, a p-channel type fifth MOS transistor having a source terminal for receiving the first voltage, a drain terminal connected to the second node, and a gate terminal for receiving a another input signal, and an n-channel type sixth MOS transistor having a source terminal for receiving the second voltage, a drain terminal connected to the second node, and a gate terminal for receiving the another input signal.

As there are a small number of elements connected in series between the two voltage lines applied with the first and second voltage, it is possible to lower the voltage.

The first element includes a seventh MOS transistor connected between the first voltage line and the first node, and the second element includes an eighth MOS transistor connected between the first node and the second voltage line. The first and second MOS transistors have driving capacities smaller than those of the seventh and eighth MOS transistors respectively. When the third inverter has been provided, the fifth and sixth MOS transistors have driving capacities smaller than those of the third and fourth MOS transistors respectively. With this arrangement, a variable range of the common level of the input signal becomes larger.

In the mean time, when the driving capacities of the third and fourth MOS transistors are set the same as those of the seventh and eighth MOS transistors respectively, the second inverter amplifies large the voltage biased on the first node.

When the seventh and eighth MOS transistors are the p-channel type and n-channel type MOS transistors respectively, the number of the p-channel type MOS transistors becomes the same as the number of the n-channel type MOS transistors.

Preferably, in each of the seventh and eighth MOS transistors, the drain terminal is connected with the gate terminal.

According to still another aspect of the invention, the semiconductor integrated circuit comprises at least one of a third element connected between a power source line for receiving a power source voltage and the first voltage line, for flowing a current from the power source line to the first voltage line, and a fourth element connected between a ground line for receiving a ground voltage and the second voltage line, for flowing a current from the second voltage line to the ground line. The first voltage line is connected in common to at least the source terminals of the first and third MOS transistors. The second voltage line is connected in common to at least the source terminals of the second and fourth MOS transistors.

The first and second voltage lines may be connected to the source terminals of the fifth and sixth MOS transistors respectively.

Other objects and features of this invention will become apparent from the following description with reference to the accompanying drawings.

DESCRIPTION OF THE PREFERRED EMBODIMENTS

Embodiments of the present invention will be explained below with reference to the accompanying drawings. The same reference numbers and symbols that are used in the drawings refer to identical or corresponding portions.

Figure 3:
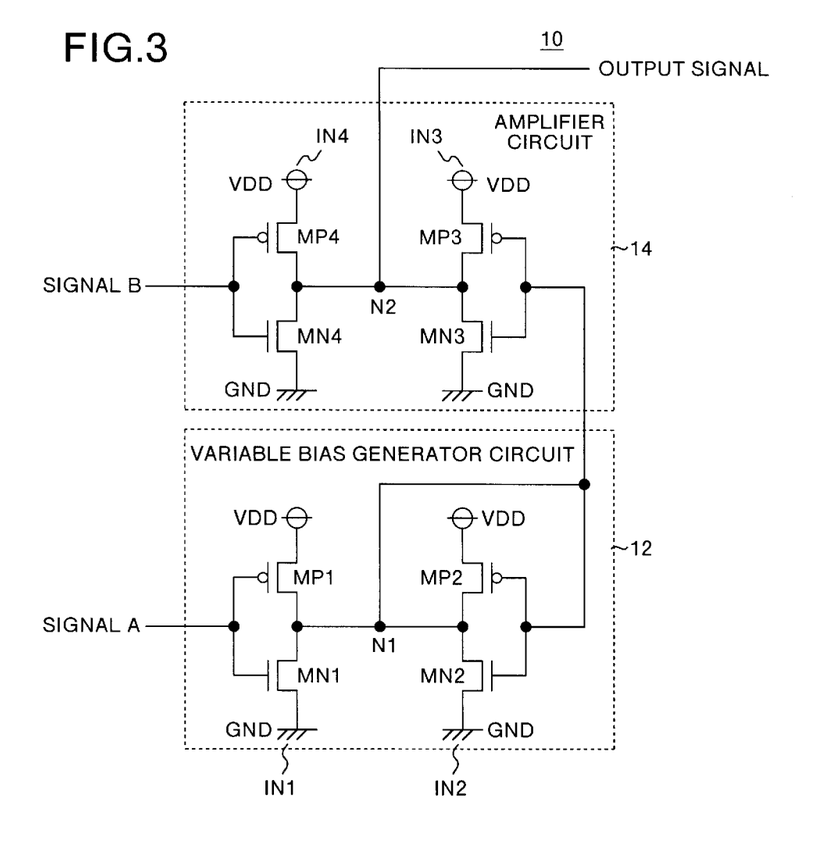
FIG. 3 is a circuit diagram of a semiconductor integrated circuit (a self-bias differential amplifier) according to a first embodiment of the present invention.

FIG. 3 shows a structure of a semiconductor integrated circuit 10 according to a first embodiment of the present invention. The semiconductor integrated circuit 10 is a self-bias differential amplifier circuit consisting of a variable bias generator circuit 12 that generate a signal having an input signal A biased near to a predetermined bias voltage, and an amplifier circuit 14 that amplifies a signal output from the variable bias generator circuit 12 by referring to an input signal B of which logic has been inverted from the logic of the input signal A, and outputs the amplified signal.

The variable bias generator circuit 12 consists of p-channel type MOS transistors MP1 and MP2, and n-channel type MOS transistors MN1 and MN2. The pMOS transistor MP1 has its source terminal connected to the power source voltage VDD, the drain terminal connected to the node N1, and the gate terminal receives the input signal A. The nMOS transistor MN1 has its source terminal connected to the ground voltage GND (=0V) lower than the power source voltage VDD, the drain terminal connected to the node N1, and the gate terminal receives the input signal A. The pMOS transistor MP2 has its source terminal connected to the power source voltage VDD, and the drain terminal and the gate terminal connected in common to the node N1. The nMOS transistor MN2 has its source terminal connected to the ground voltage GND, and the drain terminal and the gate terminal connected in common to the node N1.

The amplifier circuit 14 consists of p-channel type MOS transistors MP3 and MP4, and n-channel type MOS transistors MN3 and MN4.

The pMOS transistor MP3 has its source terminal connected to the power source voltage VDD, the drain terminal connected to the node N2, and the gate terminal connected to the node N1. The nMOS transistor MN3 has its source terminal connected to the ground voltage GND, the drain terminal connected to the node N2, and the gate terminal connected to the node N1. The pMOS transistor MP4 has its source terminal connected to the power source voltage VDD, the drain terminal connected to the node N2, and the gate terminal receives the input signal B. The nMOS transistor MN4 has its source terminal connected to the ground voltage GND, the drain terminal connected to the node N2, and the gate terminal receives the input signal B.

Figure 4:
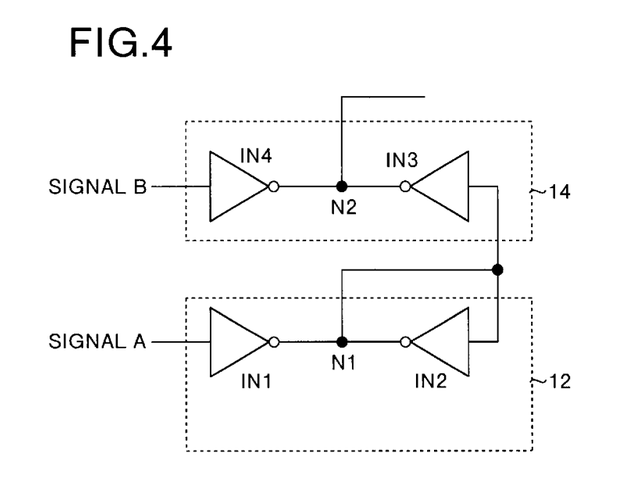
FIG. 4 is a circuit diagram showing an equivalent circuit of the semiconductor integrated circuit shown in FIG. 3.

The transistors MP1 and MN1 form a CMOS inverter IN1 for receiving the input signal A and having its output connected to the node N1. The transistors MP2 and MN2 form a CMOS inverter IN2 having its input and output connected in common to the node N1. The transistors MP3 and MN3 form a CMOS inverter IN3 having its input connected to the node N1 and having its output connected to the node N2. The transistors MP4 and MN4 form a CMOS inverter IN4 for receiving the input signal B and having its output connected to the node N2. Therefore, the semiconductor integrated circuit 10 is equivalent to a circuit shown in FIG. 4.

This semiconductor integrated circuit 10 is applied to an input buffer 4 shown in FIG. 2 like in the conventional case, and signals A and B in FIG. 2 are applied to inverters IN1 and IN4 respectively.

Figure 5:
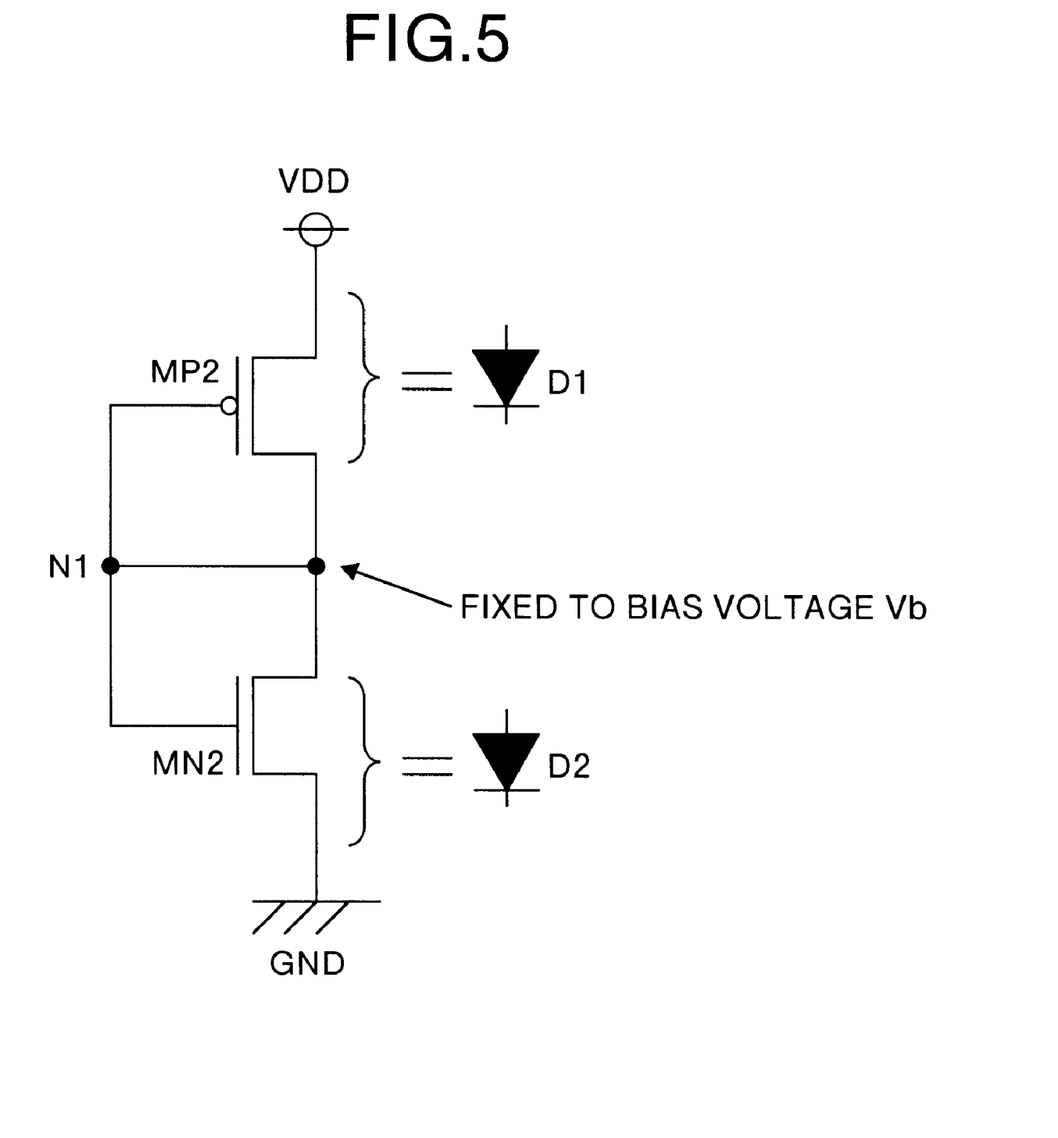
FIG. 5 is a circuit diagram showing portions of transistors MP2 and MN2 of the semiconductor integrated circuit shown in FIG. 4.

Each of the MOS transistors MP2 and MN2 has the drain terminal and the gate terminal connected in diode. As shown in FIG. 5, the transistor MP2 is equivalent to a diode element D1 having the power source line applied with the power source voltage VDD connected to the node N1 in a direction to form a forward bias. The transistor MN2 is equivalent to a diode element D2 having the node N1 connected to the ground line applied with the ground voltage GND in a direction to form a forward bias. Therefore, so long as a voltage of the node N1 is lower than the power source voltage VDD by a threshold voltage of the MOS transistor MP2, the MOS transistor MP1 becomes an element that flows a current from the power source voltage VDD to the node N1. On the other hand, so long as a voltage of the node N1 is higher than the ground voltage GND by the threshold voltage of the MOS transistor MN2, the MOS transistor MN1 becomes an element that flows a current from the node N1 to the ground voltage GND.

When the MOS transistors MP1 and MN1 are not connected to the node N1 and only the MOS transistors MP2 and MN2 are connected to the node N1, the node N1 is fixed to a certain voltage between the power source voltage and the ground voltage. This fixed voltage is called a bias voltage Vb. The transistors MP2 and MN2 are structured such that the bias voltage Vb becomes one half of the power source voltage VDD.

Figure 6A:
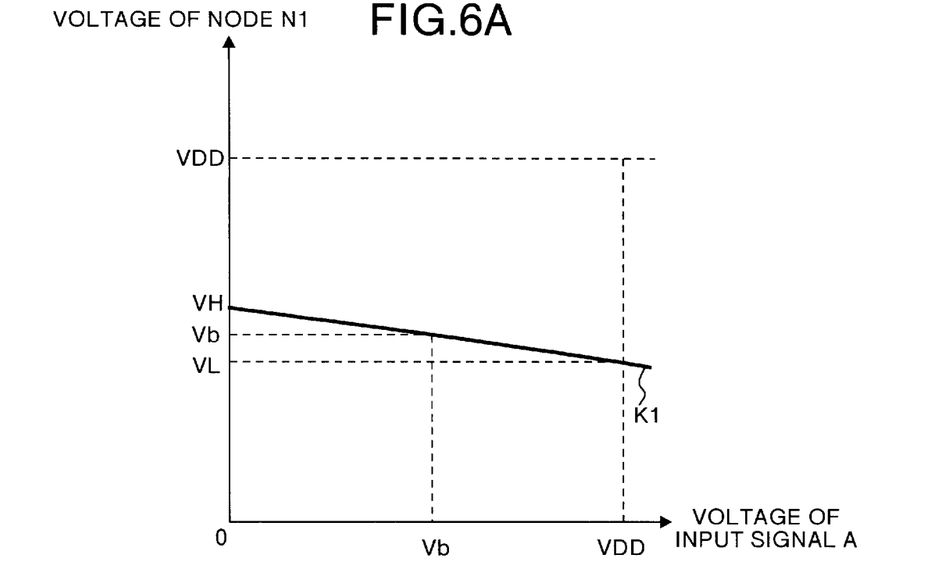
FIG. 6A is a diagram showing characteristics of a voltage of a node N1 versus a voltage of an input signal A shown in FIG. 3.

The inverter IN1 structured by the MOS transistors MP1 and MN1 supplies a current to the node N1 in response to a voltage change of an input signal, and changes the voltage of the node N1 in a direction opposite to a direction of the voltage change of the input signal. FIG. 6A is a diagram showing voltage characteristics of the node N1 versus the input signal A.

The MOS transistors MP1 and MN1 have driving capacities smaller than those of the MOS transistors MP2 and MP1 respectively. Large and small of the driving capacity is expressed as large and small of ON resistance obtained when a voltage is applied across the gate and the source that is the same voltage applied to a MOS transistor to be compared. The larger this ON resistance, the smaller the driving capacity. The larger a transistor size (gate width/gate length) of a MOS transistor, the smaller the ON resistance. Therefore, the transistor sizes of the transistors MP1 and MN1 are made smaller than the transistor sizes of the transistors MP2 and MN2 respectively.

The MOS transistors MP2 and MN2 always flow currents. These currents are sufficiently larger than the currents flown through the MOS transistors MP1 and MN1 respectively. Therefore, the inverter IN1 drives the node N1 so as to slightly bias the voltage of the node N1 from the bias voltage Vb according to the input signal. As shown in FIG. 6A, the voltage of the node N1 changes at a small rate versus a change in the voltage of the input signal A. This change rate becomes smaller when the driving capacities of the MOS transistors MP1 and MN1 become smaller than the driving capacities of the MOS transistors MP2 and MN2 respectively. When the voltage of the input signal A is equal to the bias voltage Vb, the voltage of the node N1 is also equal to the bias voltage Vb.

Figure 6B:
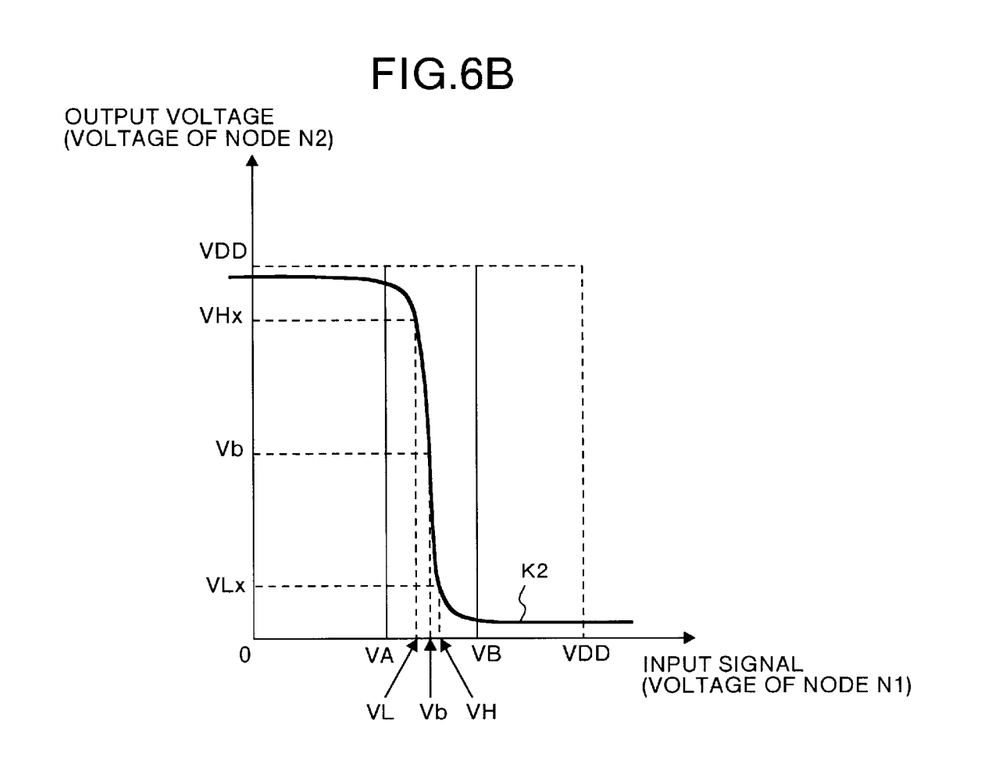
FIG. 6B is a diagram showing characteristics of an output voltage versus an input voltage of an inverter IN3 shown in FIG. 3.

The inverter IN3 structured by the MOS transistors MP3 and MN3 supplies a current to the node N2 in response to a voltage change of the node N1, and changes the voltage of the node N2 in a direction opposite to a direction of the voltage change of the node N1. FIG. 6B is a diagram showing voltage characteristics of the input voltage versus the output voltage of the inverter IN3 structured by the transistors MP3 and MN3.

The MOS transistors MP3 and MN3 have the same transistor sizes as the transistor sizes of the MOS transistors MP2 and MN2 respectively, and thus have the same driving capacities. Therefore, when the inverter IN3 has received an input voltage equivalent to the bias voltage Vb, the inverter IN3 outputs a voltage equal to the bias voltage Vb. As shown by a solid line K2, the inverter IN3 has a high amplification gain (a change rate of an output voltage versus an input voltage) near the bias voltage Vb. The output voltage lowers steeply even when the input voltage is slightly higher than the bias voltage Vb, and the output voltage increases steeply even when the input voltage is slightly lower than the bias voltage Vb.

Referring to FIG. 6A again, the node N1 shows a voltage VL when the voltage of the input signal A is equal to the power source voltage VDD, and the node N1 shows a voltage VH when the voltage of the input signal A is equal to the ground voltage GND (VL<Vb<VH). In the mean time, referring to FIG. 6B again, when the output voltage starts falling after gradually increasing the input voltage of the inverter IN3 from 0V, the input voltage at this time of the starting of the fall of the output voltage is expressed as VA.

Conversely, when the output voltage starts rising after gradually lowering the input voltage of the inverter IN3 from VDD, the input voltage at this time of the starting of the rise of the output voltage is expressed as VB.

The driving capacities of the MOS transistors MP1 and MN1 are smaller than the driving capacities of the MOS transistors MP2 and MN2 respectively by the magnitude that the voltages VL and VH are set to values nearer the bias voltage Vb than the voltages VA and VB respectively. When the voltage of the node N1 is at VH and VL respectively, the node N2 shows a voltage VLx and a voltage VHx respectively (VLx<Vb<VHx, and a difference (VHx−VLx) is sufficiently larger than a difference (VH−VL)). The inverter IN3 amplifies a voltage of the signal on the node N1 having an amplitude near the bias voltage Vb.

Figure 7:
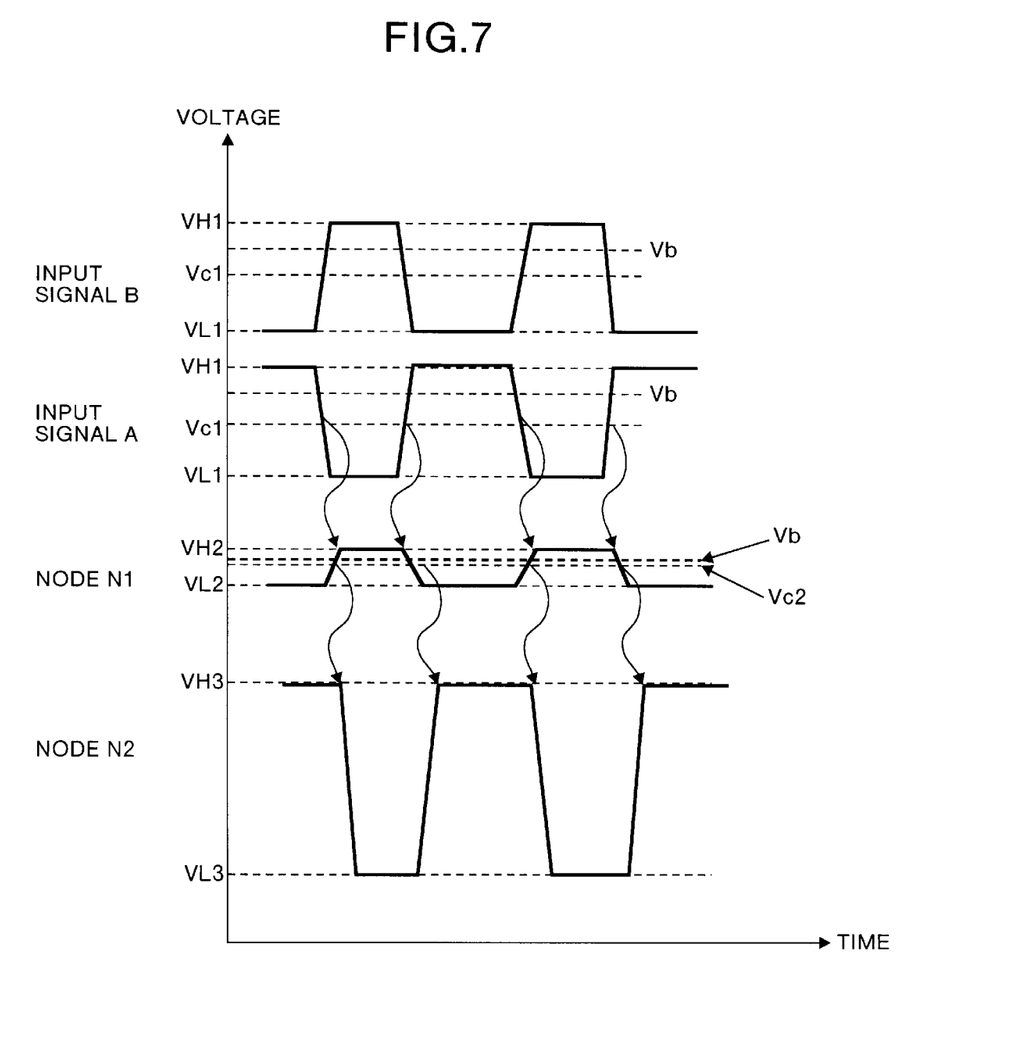
FIG. 7 is a waveform diagram showing waveforms of the nodes N1 and N2 versus waveforms of the input signals A and B shown in FIG. 3.

FIG. 7 is a timing chart showing voltage variations of the input signals A and B and the nodes N1 and N2 respectively.

The semiconductor integrated circuit 10 receives the input signals A and B having an input common level Vc smaller than the bias voltage Vb, a high-level maximum voltage VH1, and a low-level minimum voltage VL1 respectively. The maximum voltage VH1 is larger than the bias voltage Vb. The minimum voltage VL is smaller than the bias voltage Vb. The input common level Vc1 is smaller than the bias voltage Vb. It is assumed here that the amplitude (VH1−VL1) of the input signal is smaller than the power source voltage VDD. For example, this amplitude is about one fifth of the power source voltage VDD.

Figure 8A:
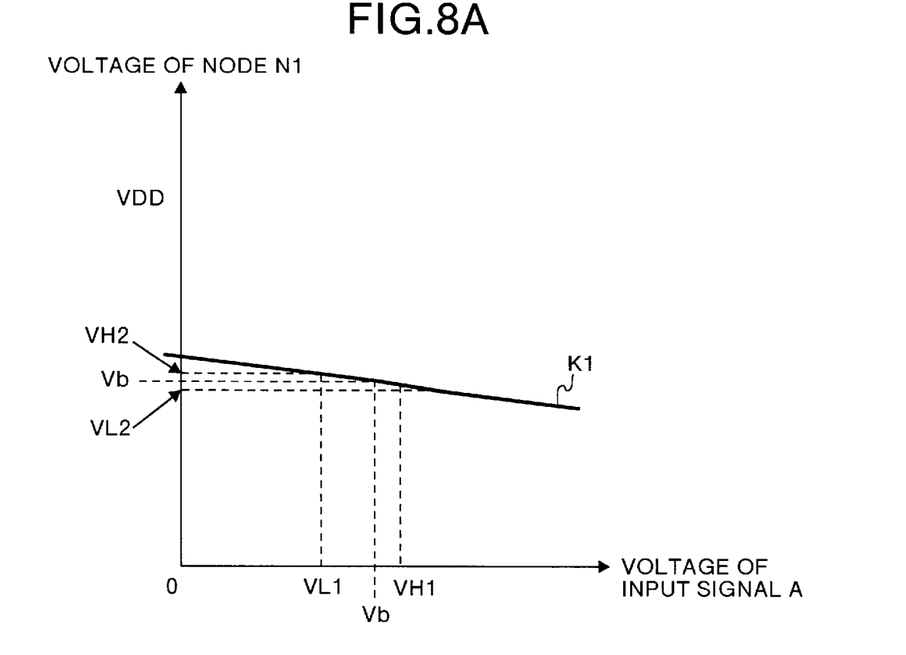
FIG. 8A is a diagram showing characteristics of a voltage of a node N1 versus a voltage of an input signal A shown in FIG. 3.
Figure 8B:
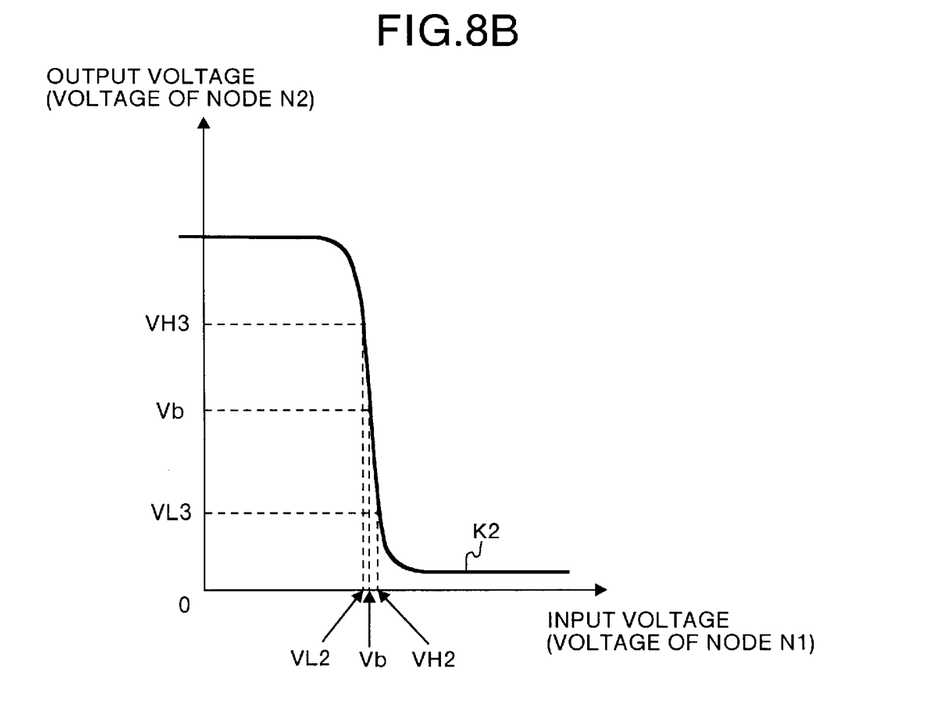
FIG. 8B is a diagram showing characteristics of an output voltage versus an input voltage of an inverter IN3 shown in FIG. 3.

FIG. 8A and FIG. 8B are similar to the FIG. 6A and FIG. 6B respectively. In FIG. 8A, when the input signal A takes the maximum voltage VH1 and the minimum voltage VL1, the node N1 takes voltages VL2 and VH2 respectively. In FIG. 8B, when the node N1 takes the voltages VH2 and VL2, the node N2 takes voltages VL3 and VH3 respectively.

Referring to FIG. 7, when the input signal A changes from the high level to the low level, the node N1 rises from the low level of the voltage VL2 to the high level of the voltage VH2. Conversely, when the input signal A changes from the low level to the high level, the node N1 falls from the high level of the voltage VH2 to the low level of the voltage VL2. The amplitude (VH2−VL2) of the node N1 becomes smaller than (VH1−VL1). However, the common level Vc2 (=(VH2+VL2)/2) of the node N1 becomes closer to the bias voltage Vb than to the common level Vc of the input signal A. When the node N1 changes from the low level to the high level, the node N2 falls from the high level of the voltage VH3 to the low level of the voltage VL3. When the node N1 changes from the high level to the low level, the node N2 rises from the low level to the high level.

The inverter IN4 structured by the MOS transistors MP4 and MN4 supplies a current from the node N2 in response to a voltage change of the input signal B, and changes a voltage of the input signal B in a direction opposite to a direction of the voltage change of the input signal B. As the inverter IN4 has a function of improving the amplification gain of the inverter IN3, the inverter IN4 changes the voltage of the node N3 at a high speed.

The voltages VH and VL are set to the values closer to the bias voltage Vb within the range of the voltage VA to the voltage VB, as shown in FIG. 6A and FIG. 6B. Therefore, even when the input common levels Vc1 of the input signals A and B respectively have changed much closer to the ground voltage GND than the case shown in FIG. 7, or when the common levels Vc1 have changed closer to the power source voltage VDD beyond the bias voltage Vb, the semiconductor integrated circuit can output from the node N2 a signal of which voltage changes in response to the input signal A.

Figure 9A:
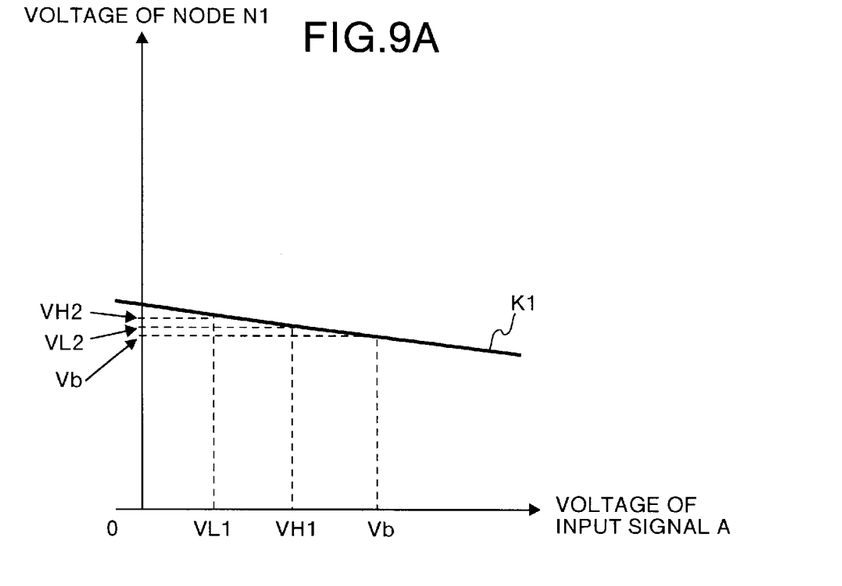
FIG. 9A is a diagram showing characteristics of a voltage of a node N1 versus a voltage of an input signal A shown in FIG. 3.
Figure 9B:
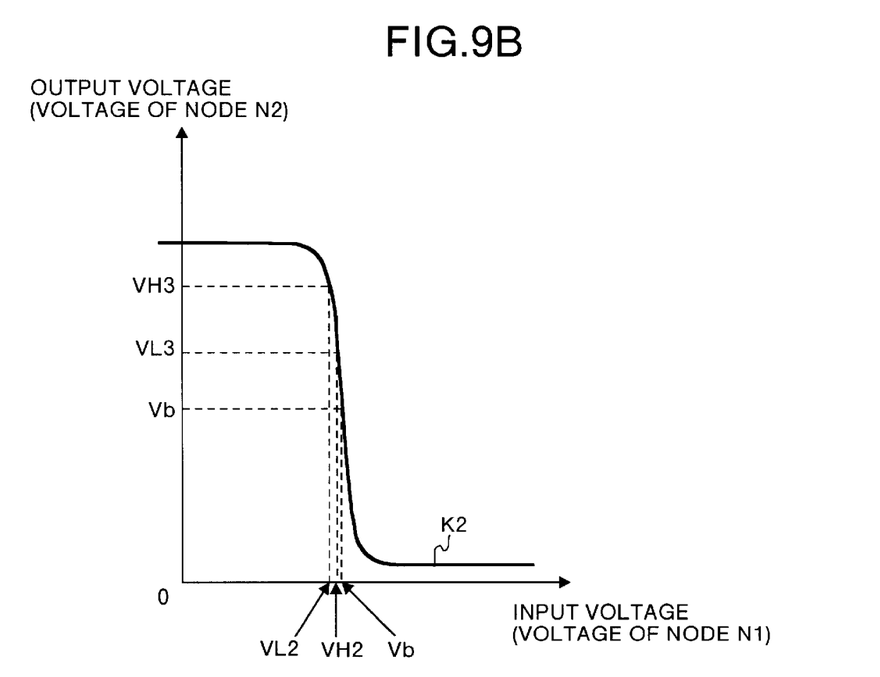
FIG. 9B is a diagram showing characteristics of an output voltage versus an input voltage of an inverter IN3 shown in FIG. 3.

FIG. 9A and FIG. 9B are similar to the FIG. 6A and FIG. 6B respectively. As shown in these figures, when the high-level voltage VH1 and the low-level voltage VL1 of the input signal A are smaller than the bias voltage Vb respectively, the voltage of the node N1 has an amplitude between the voltage VL2 and the voltage VH2 higher than the bias voltage Vb respectively. However, the common level Vc2 is biased nearer to the bias voltage Vb as compared with the common level Vc1 of the input signal A. As the inverter IN3 can amplify the signal having an amplitude near the bias voltage Vb, the voltage of the node N2 has an amplitude between the voltage VH3 and the voltage VL3 that are lower than the bias voltage Vb.

When the common level of the input signal has changed substantially, the inverter IN4 interferes with the inverter IN3 in amplifying the signal. In order to overcome this difficulty, the MOS transistors MP4 and MN4 have driving capacities (that is, the transistor sizes) smaller than the driving capacities of the MOS transistors MP2 and MN3 respectively. Thus, the driving capacity of the inverter IN4 is set smaller than the driving capacity of the inverter IN3. As a result, a signal having a high-level voltage substantially the same as the voltage VH3 and a low-level voltage substantially the same as the voltage VL3 is obtained from the node N2.

Further, when the common levels Vc1 of the input signals A and B respectively have become equal to or lower than the ground voltage GND or equal to or higher than the power source voltage VDD, a signal of which voltage changes in response to the input signal A is output from the node N2.

It is preferable that the four MOS transistors used in the inverters IN1 and IN4 are changed to MOS transistors of higher withstanding voltage, in order to prepare for a case where the voltages of the input signals A and B become lower than the ground voltage GND or higher than the power source voltage VDD.

As explained above, according to the first embodiment, the MOS transistors MP2 and MN2 convert the common level of the input signal A to a signal biased near to the bias voltage Vb in the node N1. Then, the inverter IN3 amplifies the voltage of the node N1. Therefore, even when the common level of the input signal A has varied, it is possible to output a signal from the node N2 in response to the input signal A.

Furthermore, since the MOS transistors MP3 and MN3 have driving capacities substantially equal to the driving capacities of the MOS transistors MP2 and MN2 respectively, the inverter IN3 is set to have a large amplification degree near the bias voltage Vb. As a result, it is possible to amplify the voltage of the node N1 at a high speed.

Furthermore, since the driving capacities of the MOS transistors MP1 and MN1 are set smaller than the driving capacities of the MOS transistors MP2 and MN2 respectively, it is possible to take a large variable range of the common level of the input signal A.

Furthermore, in the conventional circuit shown in FIG. 1, three MOS transistors are connected in series between the voltage lines applied with two driving voltages (the power source voltage VDD and the ground voltage GND). Particularly, the MOS transistor TP1 is connected in diode, and the voltage applied across the source and the drain of the MOS transistor TP1 requires at least a threshold voltage. On the other hand, according to the first embodiment, since only two MOS transistors are connected, the structure is suitable for a low-voltage power source.

Moreover, in the conventional circuit there is required a mechanism for generating a bias voltage to be applied to the constant current source TN3. Therefore, this structure requires power consumption. On the other hand, according to the first embodiment, as this bias voltage is not necessary, it is possible to reduce power consumption.

Figure 10:
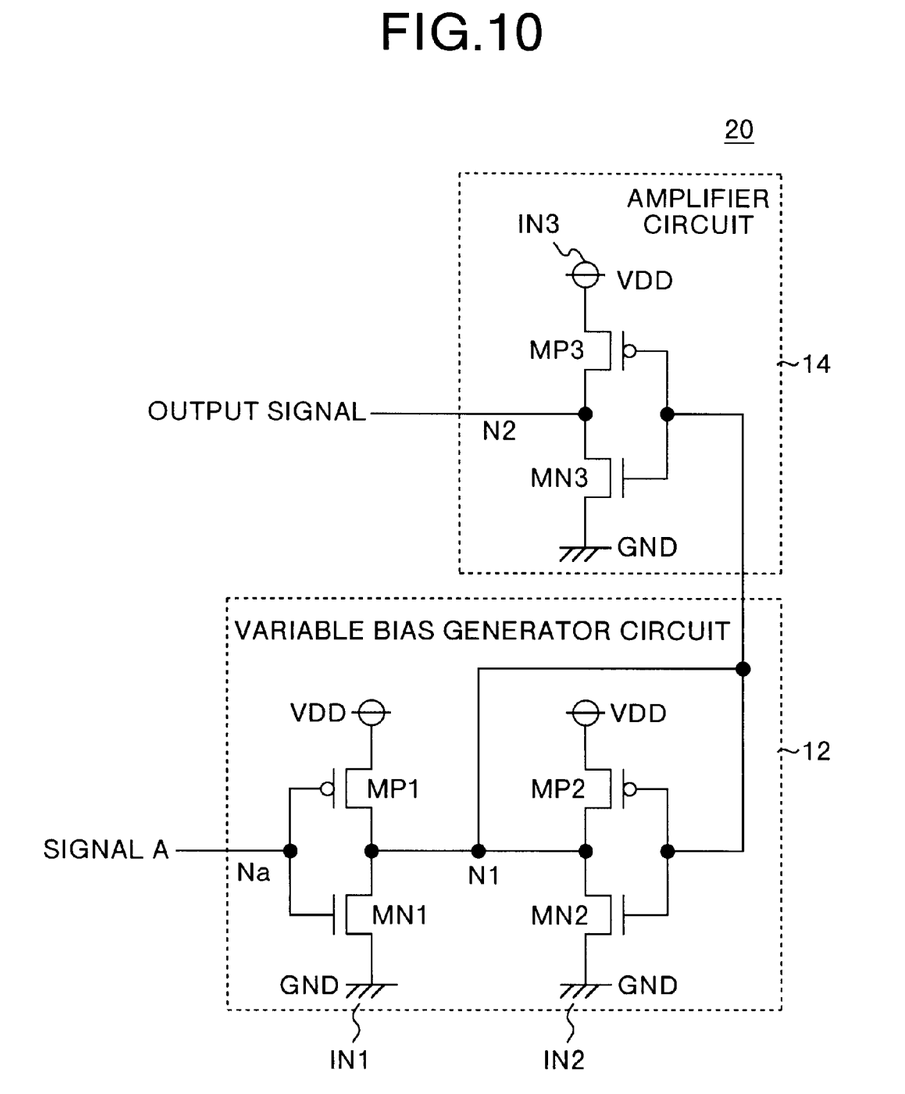
FIG. 10 is a circuit diagram of a semiconductor integrated circuit (a self-bias differential amplifier) according to a second embodiment of the present invention.

In FIG. 2, the output buffer 2 outputs the two signals A and B of mutually opposite phases. However, for outputting a single signal, the input buffer 4 is structured by a single-end type amplifier circuit. FIG. 10 is a structure diagram showing a semiconductor integrated circuit 20 according to a second embodiment of the present invention. The semiconductor integrated circuit 20 is a single-end type amplifier circuit for amplifying a single input signal A, and this circuit has a structure exactly equivalent to the structure of FIG. 3 after having the inverter IN4 excluded.

As is clear from the above explanation, as the driving capacity of the inverter IN4 is sufficiently smaller than the inverter IN3, only an inverter IN3 can sufficiently drive a node N3. A node N1 for the input signal A and a voltage change of an output signal are practically the same as those shown in FIG. 7.

A single-end type amplifier circuit can be realized by applying a fixed reference voltage Vref to the transistor TN2 in place of the signal B, for example, in the conventional technique shown in FIG. 1. However, the amplifier circuit does not operate when the high level of the signal A becomes equal to or lower than the reference voltage Vref or when the low level of the signal A becomes equal to or higher than the reference voltage Vref as a result of a variation in the input common level of the input signal A. On the other hand, according to the second embodiment, a signal of which voltage changes in response to the input signal A is output regardless of the input common level of the single input signal A.

Furthermore, since the reference voltage Vref is not required, it is not necessary to have a structure for generating the reference voltage Vref. As a result, it is possible to reduce power consumption.

Figure 11:
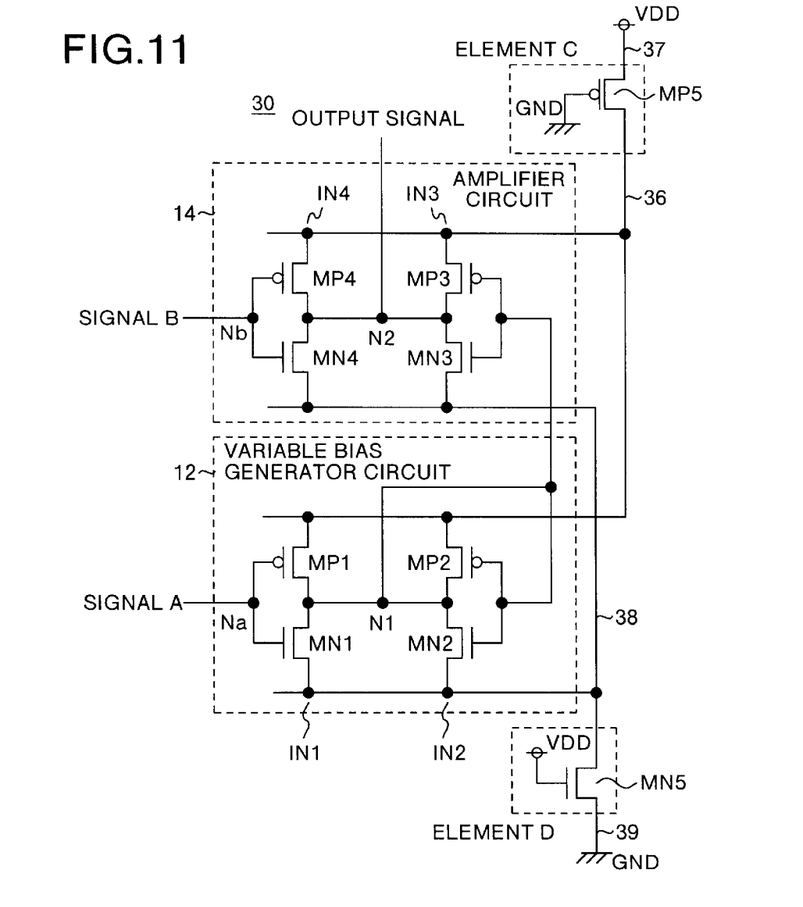
FIG. 11 is a circuit diagram of a semiconductor integrated circuit (a self-bias differential amplifier) according to a third embodiment of the present invention.

FIG. 11 is a structure diagram showing a semiconductor integrated circuit 30 according to a third embodiment of the present invention. The semiconductor integrated circuit 30 consists of a voltage line 36 connected in common to source terminals of transistors MP1 to MP4 respectively, a voltage line 38 connected in common to source terminals of transistors MN1 to MN4 respectively, a power source line 37 applied with a power source voltage VDD, an element C connected between the power source line 37 and the voltage line 36, for flowing a current from the power source line 37 to the voltage line 36, a ground line 39 applied with a ground voltage GND, and an element D connected between the ground line 39 and the voltage line 38, for flowing a current from the voltage line 38 to the ground line 39. All other structures are the same as those of FIG. 1. The structure having the elements C and D can also be applied to the semiconductor integrated circuit in the second embodiment. In other words, in FIG. 11, the inverter IN4 may be eliminated.

The element C includes the pMOS transistor MP5 with its source terminal connected to the power source voltage VDD, the drain terminal connected to the power source line 36, and the gate terminal connected to the ground voltage GND, and is always conductive. The element D includes the nMOS transistor MN5 with its source terminal connected to the ground voltage GND, the drain terminal connected to the power source line 38, and the gate terminal connected to the power source voltage VDD, and is always conductive.

The function of the elements C and D it to reduce power consumption of the circuit by integrating the power sources for supplying power to the inverters IN1 to IN4.

The elements C and D can adjust currents supplied to the inverters IN1 to IN4, thereby to be able to reduce power consumption in the range for guaranteeing the circuit operation. Specifically, by adjusting the transistor sizes of the transistors MP5 and MN5, it is possible to adjust values of currents generated.

Noise generated in the power source line 37 and the ground line 39 is dumped by the elements C and D respectively, and is propagated to the voltage lines 36 and 38 respectively. Thus, there is also an effect of reducing noise.

The MOS transistors MP5 and MN5 may function as constant current sources by operating in a saturated area, or may function as resistors by operating in a linear area. Furthermore, the elements C and D may include simple resistor elements in place of the MOS transistors.

Moreover, for reducing the power source voltage VDD, it may be arranged such that the elements C or D is connected to one of the power source line 36 and the ground line 38, and the power source voltage VDD or the ground voltage GND is directly applied to the other.

Figure 12A:
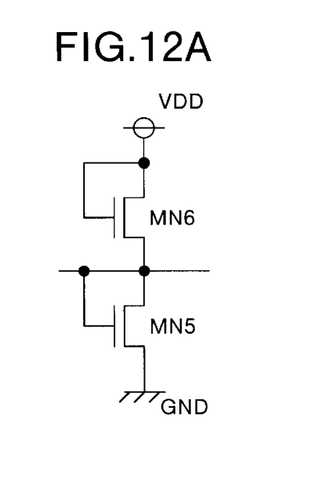
FIG. 12A to FIG. 12C are circuit diagrams showing another example of a circuit for generating a bias voltage Vb according to a fourth embodiment of the present invention.

In the first to third embodiments, the inverter IN2 that generates the bias voltage Vb may be replaced with the structure comprising the MOS transistors MN5 and MN6 of the same conductive type (n-channel type in the drawing) shown in FIG. 12A. The MOS transistor MN6 has a drain terminal for commonly receiving a power source voltage VDD, and a source terminal connected to a node N1. The MOS transistor MN5 is identical with the MOS transistor MN1.

Figure 12B:
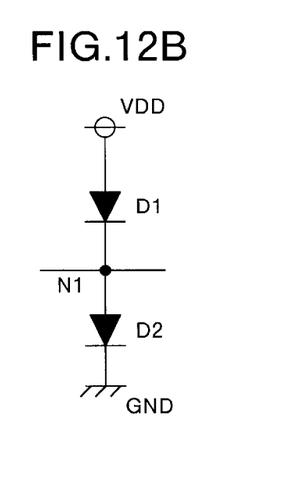

Furthermore, as shown in FIG. 12B, two diodes D1 and D2 consisting of a simple PN junction may be employed. The diode D1 has a connection from a power source voltage VDD to a node N1 in a forward direction. The diode D2 has a connection from the node N1 to a ground voltage GND in a forward direction.

Figure 12C:
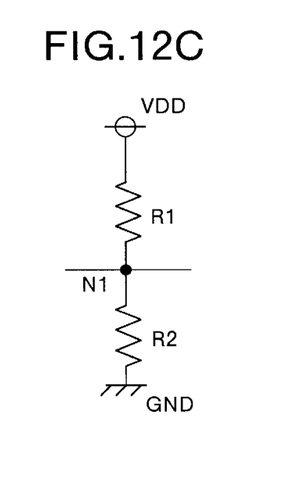

Furthermore, the inverter IN2 may be replaced with the structure, shown in FIG. 12C, having a resistance R1 connected between the power source line for receiving the power source voltage VDD and the node N1, and a resistance R2 connected between the node N1 and the ground line for receiving the ground voltage GND.

When any one of the structure shown in FIG. 12A to FIG. 12C is used in place of the inverter IN2, the first element for flowing a current from the power source voltage VDD to the node N1 and the second element for flowing a current from the node N1 to the ground voltage GND set the ON resistance larger than the ON resistance of the two elements MP1 and MN1 that constitute the inverter IN1 respectively. As a result, the first and second elements flow currents larger than the currents flown through the elements MP1 and MN1 respectively.

As explained above, according to the semiconductor integrated circuit of the present invention, even when the common level of the input signal has varied, it is possible to output a signal of which signal level changes in response to the input signal.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor integrated circuit comprising:
a first element connected between a first node and a first voltage line applied with a first voltage, for flowing a current from the first voltage line to the first node;
a second element connected between the first node and a second voltage line applied with a second voltage lower than the first voltage, for flowing a current from the first node to the second voltage line;
a first inverter having its output connected to the first node, for changing a voltage of the first node in a direction opposite to a direction of a voltage change of an input signal in response to the voltage change of the input signal;
a second inverter having its output connected to a second node for output, for changing a voltage of the second node in a direction opposite to a direction of a voltage change of the first node in response to the voltage change of the first node; and
a third element connected between a power source line for receiving a power source voltage and the first voltage line, for flowing a current from the power source line to the first voltage line,
wherein the first voltage line is connected in common to the first and second inverters.

2. The semiconductor integrated circuit according to claim 1 further comprising a third inverter for changing a voltage of the second node in a direction opposite to a direction of a voltage change of an another input signal in response to the voltage change of the another input signal.

3. The semiconductor integrated circuit according to claim 1,
wherein the first inverter has a fourth element connected between a third voltage line and the first node, the third voltage line being applied with the first voltage and it flows a current from the third voltage line to the first node, and a fifth element connected between a fourth voltage line and the first node, the fourth voltage line being applied with the second voltage and it flows a current form the first node to the fourth voltage line, and
the first and second elements always flow currents, and the currents flown by the first and second elements are set larger than the currents flown by the fourth and fifth elements respectively.

4. The semiconductor integrated circuit according to claim 3, further comprising:
a third inverter for changing a voltage of the second node in a direction opposite to a direction of a voltage change of an another input signal in response to the voltage change of the another input signal,
wherein the second inverter includes a MOS transistor having a drain terminal connected to the second node and a gate terminal connected to the first node, and
the third inverter includes a MOS transistor having a drain terminal connected to the second node and a gate terminal for receiving the another input signal, with a MOS transistor having a driving capacity smaller than that of the second MOS transistor.

5. The semiconductor integrated circuit according to claim 1 further comprising:
a fourth element connected between a ground line for receiving a ground voltage and the second voltage line, for flowing a current from the second voltage line to the ground line,
wherein the second voltage line is connected in common to the first and second inverters.

6. A semiconductor integrated circuit comprising:
a first element connected between a first node and a first voltage line applied with a first voltage, for flowing a first current from the first voltage line to the first node;
a second element connected between the first node and a second voltage line applied with a second voltage lower than the first voltage, for flowing a second current from the first node to the second voltage line;
a p-channel type first MOS transistor having a source terminal for receiving the first voltage, a drain terminal connected to the first node, and a gate terminal for receiving an input signal;
an n-channel type second MOS transistor having a source terminal for receiving the second voltage, a drain terminal connected to the first node, and a gate terminal for receiving an input signal;
a p-channel type third MOS transistor having a source terminal for receiving the first voltage, a drain terminal connected to a second node for output, and a gate terminal connected to the first node;
an n-channel type fourth MOS transistor having a source terminal for receiving the second voltage, a drain terminal connected to the second node, and a gate terminal connected to the first node; and
a third element connected between a power source line for receiving a power source voltage and the first voltage line, for flowing a current from the power source line to the first voltage line,
wherein the first voltage line is connected in common to source terminals of the first and third MOS transistors.

7. The semiconductor integrated circuit according to claim 6, further comprising:
a p-channel type fifth MOS transistor having a source terminal for receiving the first voltage, a drain terminal connected to the second node, and a gate terminal for receiving another input signal; and
an n-channel type sixth MOS transistor having a source terminal for receiving the second voltage, a drain terminal connected to the second node, and a gate terminal for receiving the another input signal.

8. The semiconductor integrated circuit according to claim 7,
wherein the first element includes a seventh MOS transistor connected between the first voltage line and the first node,
the second element includes an eighth MOS transistor connected between the first node and the second voltage line,
the first and second MOS transistors have driving capacities smaller than those of the seventh and eighth MOS transistors respectively, and
the fifth and sixth MOS transistors have driving capacities smaller than those of the third and fourth MOS transistors respectively.

9. The semiconductor integrated circuit according to claim 6,
wherein the first element includes a seventh MOS transistor connected between the first voltage line and the first node,
the second element includes an eighth MOS transistor connected between the first node and the second voltage line, and the first and second MOS transistors have driving capacities smaller than those of the seventh and eighth MOS transistors respectively.

10. The semiconductor integrated circuit according to claim 8,
wherein the seventh and eighth MOS transistors are a p-channel type MOS transistor and an n-channel type MOS transistor respectively.

11. The semiconductor integrated circuit according to claim 9,
wherein the seventh and eighth MOS transistors are a p-channel type MOS transistor and an n-channel type MOS transistor respectively.

12. The semiconductor integrated circuit according to claim 8, wherein the fifth and sixth MOS transistors have driving capacities that are substantially the same as those of the third and fourth MOS transistors respectively.

13. The semiconductor integrated circuit according to claim 6,
wherein the first element is a seventh MOS transistor having a drain terminal and a gate terminal connected with each other, and
the second element is an eighth MOS transistor having a drain terminal and a gate terminal connected with each other.

14. The semiconductor integrated circuit according to claim 13,
wherein the seventh MOS transistor is a p-channel type MOS transistor having a source terminal connected to the first voltage line, and
the eighth MOS transistor is an n-channel type MOS transistor having a source terminal connected to the second voltage line.

15. The semiconductor integrated circuit according to claim 6, further comprising:
a fourth element connected between a ground line for receiving a ground voltage and the second voltage line, for flowing a current from the second voltage line to the ground line,
wherein the second voltage line is connected in common to source terminals of the second and fourth MOS transistors.

16. The semiconductor integrated circuit according to claim 8, wherein the first voltage line is connected in common to source terminal of the fifth MOS transistor.

17. The semiconductor integrated circuit according to claim 8, wherein the second voltage line is connected in common to source terminal of the sixth MOS transistor.

* * * * *